United States Patent
Im et al.

(10) Patent No.: US 7,057,951 B2
(45) Date of Patent: Jun. 6, 2006

(54) SEMICONDUCTOR MEMORY DEVICE FOR CONTROLLING WRITE RECOVERY TIME

(75) Inventors: Jae-Hyuk Im, Ichon-shi (KR); Woon-Bok Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 40 days.

(21) Appl. No.: 10/877,038

(22) Filed: Jun. 24, 2004

(65) Prior Publication Data

US 2005/0099837 A1   May 12, 2005

(30) Foreign Application Priority Data

Oct. 31, 2003   (KR) .................. 10-2003-0076796

(51) Int. Cl.
*G11C 7/00* (2006.01)

(52) U.S. Cl. ...................... 365/203; 365/193

(58) Field of Classification Search ............ 365/203, 365/193
See application file for complete search history.

(56) References Cited

U.S. PATENT DOCUMENTS

RE36,532 E  *  1/2000  Kim ..................... 365/203
RE37,273 E  *  7/2001  Shinozaki ............. 365/233

* cited by examiner

*Primary Examiner*—Michael Tran
(74) *Attorney, Agent, or Firm*—Blakely Sokoloff Taylor & Zafman (57) ABSTRACT

A semiconductor memory device includes a CAS latency mode detecting means for outputting a CAS latency control signal in response to a CAS latency mode; and an auto-precharge control means for controlling timing of an auto-precharge operation in response to the CAS latency control signal.

19 Claims, 6 Drawing Sheets

SEMICONDUCTOR MEMORY DEVICE FOR CONTROLLING WRITE RECOVERY TIME

FIELD OF INVENTION

The present invention relates to a semiconductor memory device; and, more particularly, to a semiconductor memory device having ability of controlling timing of an auto-precharge operation depending on a column address strobe (CAS) latency mode.

DESCRIPTION OF PRIOR ART

An operational speed of a semiconductor memory device is an important factor to evaluate performance of the semiconductor memory device. Particularly, a write recovery time is one of factors which have influence on the operational speed of the semiconductor memory device.

After a data is stored into a unit cell included in the semiconductor memory device, a precharge operation is performed. Herein, there exists a time period before performing the precharge operation for the data to be stably stored into the unit cell not being prevented by the precharge operation.

The time period is called the write recovery time. That is, the write recovery time is a minimum time required for stably storing the data into the unit cell not being prevented by the precharge operation.

There have been introduced various ways for controlling the write recovery time. For instance, the write recovery time can be controlled using a clock signal. That is, in case that a mode register set (MRS) is set for a burst length to be 2, the write recovery time is a duration from a rising edge of the clock signal which a second data is inputted synchronizing with to a rising edge of the clock signal which a precharge command signal is inputted synchronizing with.

Generally, there are three ways for controlling the write recovery time, i.e., a synchronous method, an asynchronous method and admixed method.

In case of the synchronous method, the write recovery time is controlled using the clock signal as described above. That is, the precharge operation is performed synchronizing with the clock signal after the burst length and predetermined cycles of the clock signal. In case of the asynchronous method, the precharge operation is performed after the burst length and a predetermined delay time. The mixed method uses both of the synchronous method and the asynchronous method.

Those methods for controlling the write recover time are selected depending on various factors such as an operating frequency, a manufacturing process, an operating voltage and a temperature of the semiconductor memory device.

Generally, the synchronous method is adopted if there exist many variations on the manufacturing process; and the asynchronous method is adopted if the operating frequency is broad-banded.

Figure 1:
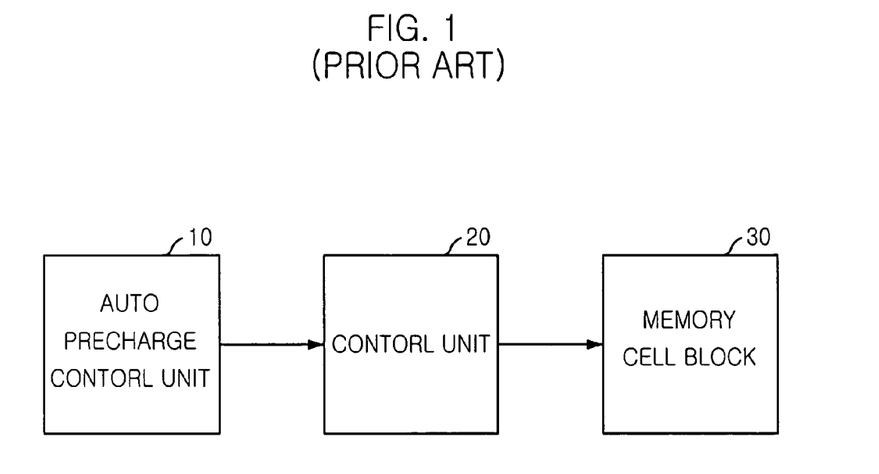
FIG. 1 is a block diagram showing a conventional semiconductor memory device.

FIG. 1 is a block diagram showing a conventional semiconductor memory device.

As shown, the conventional semiconductor memory device includes an auto-precharge control unit 10, a control unit 20 and a memory cell block 30.

The auto-precharge control unit 10 generates a precharge control signal pc to control the control unit 20. The control unit 20 controls the memory cell block 30 in response to the precharge control signal pc so that the memory cell block 30 performs an auto-precharge operation and a data access operation. The memory cell block 30 is provided with a plurality of unit cells.

To perform the data access operation, the conventional semiconductor memory device amplifies a data included in a selected unit cell, and the amplified data is latched by a sense-amplifier.

Thereafter, in case that the data access operation is performed for reading data from the conventional semiconductor memory device, the data latched by the sense-amplifier is outputted to the outside of the conventional semiconductor memory device. In case that the data access operation is performed for writing data to the conventional semiconductor memory device, an inputted data to be written is latched by the sense-amplifier. Herein, if the inputted data to be written is equal to the data latched by the sense-amplifier, the sense-amplifier keeps its data. On the other hand, if the inputted data to be written is different from the data latched by the sense-amplifier, the sense-amplifier inverts its data. Then, the data latched by the sense-amplifier is stored into the selected unit cell.

Thereafter, the sense-amplifier is precharged. This operation, i.e., the precharge operation was performed by an external precharge command signal when the operational speed of a semiconductor memory device was slow. However, at present, as a semiconductor memory device operates at a high speed, an internal prechrage command signal is generated and the precharge operation is performed automatically. That is, after completing an operation corresponding to an inputted command signal, the precharge operation is performed automatically after a predetermined time is passed. This automatically performed precharge operation is called an auto-precharge operation.

Figure 2:
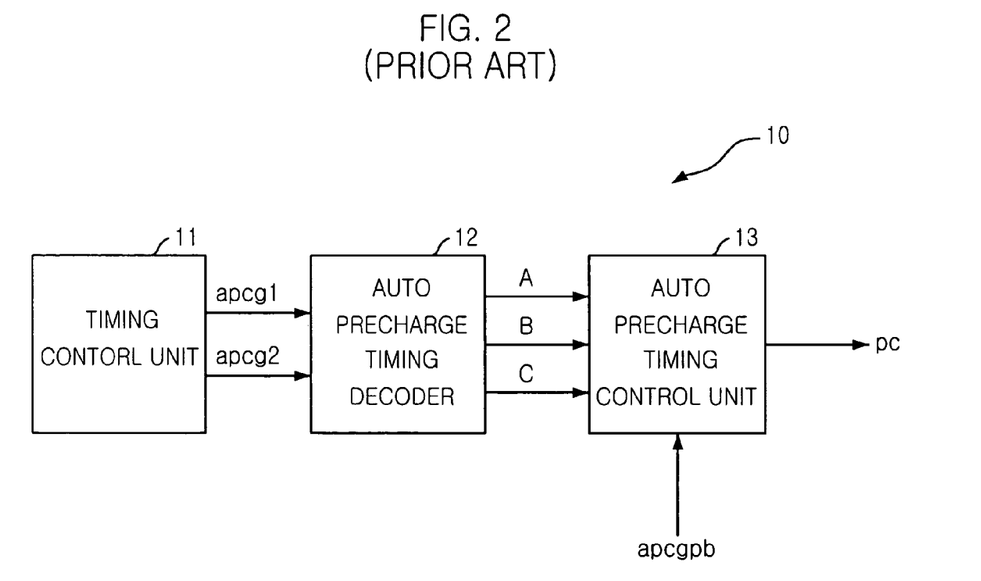
FIG. 2 is a block diagram showing an auto precharge control unit shown in FIG. 1.

FIG. 2 is a block diagram showing the auto-precharge control unit 10.

As shown, the auto-precharge control unit 10 includes a timing control unit 11, an auto-precharge timing decoder 12 and an auto-precharge timing control unit 13.

The timing control unit 11 generates a first auto-precharge control signal apcg1 and a second auto-precharge control signal apcg2 to control timing of the auto-precharge operation after comparing timing of the auto-precharge operation expected when the conventional semiconductor memory device is designed with timing of the auto-precharge operation when the conventional semiconductor memory device is manufactured. The auto-precharge timing decoder 12 decodes the first and the second auto-precharge control signals apcg1 and apcg2 in order to output a plurality of decoded signals A, B and C. The auto-precharge timing control unit 13 receives an auto-precharge performing signal apcgpb for outputting the auto-precharge performing signal apcgpb as the precharge signal pc after adjusting output timing of the auto-precharge performing signal apcgpb in response to the plurality of decoded signals A, B and C.

Herein, as described above, the first auto-precharge control signal apcg1 and the second auto-precharge control signal apcg2 are used for compensating time difference between timing of the auto-precharge operation expected when the conventional semiconductor memory device is designed with timing of the auto-precharge operation when the conventional semiconductor memory device is manufactured. The first auto-precharge control signal apcg1 and the second auto-precharge control signal apcg2 are also used for arbitrarily control timing of the auto-precharge operation.

Figure 3:
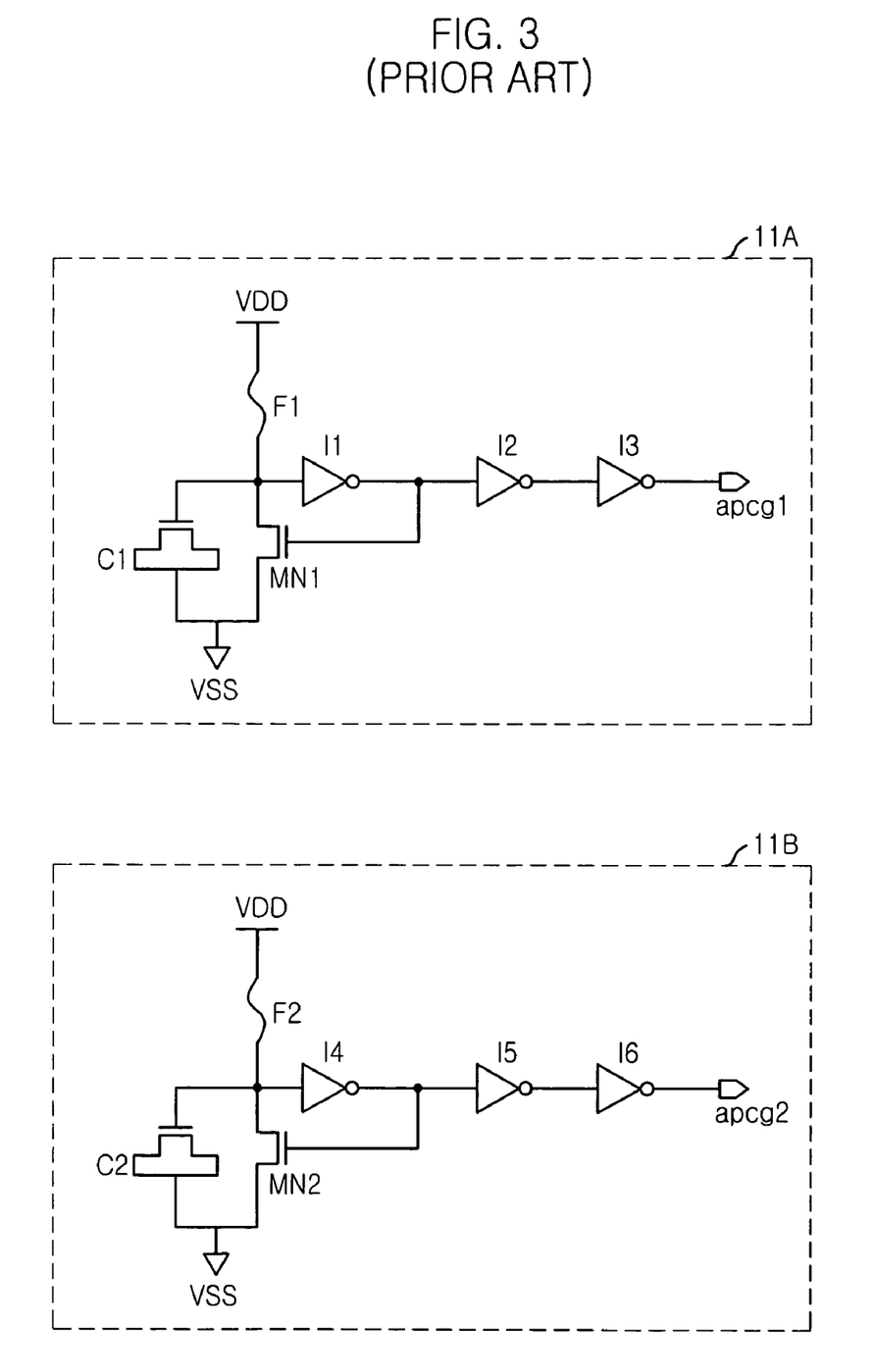
FIG. 3 is a schematic circuit diagram showing a timing control unit shown in FIG. 2.

FIG. 3 is a schematic circuit diagram showing the timing control unit 11.

As shown, the timing control unit 11 includes a first and a second unit timing control units 11A and 11B.

The first unit timing control unit 11A includes a first fuse F1, a first capacitor C1, a first metal oxide semiconductor (MOS) transistor MN1 and a plurality of inverters I1, I2 and I3.

One side of the first fuse F1 is connected to a power supply voltage VDD and the other side is connected to the first capacitor C1, the first MOS transistor MN1 and the inverter I1. A gate of the MOS transistor MN1 is connected to an output of the inverter I1. One side of the first capacitor C1 is connected to the first fuse F1, the MOS transistor MN1 and the inverter I1 and the other side is connected to a ground voltage VSS. The inverters I2 and I3 serve to buffer an output signal from the inverter I1 for outputting the first auto-precharge control signal apcg1.

The second unit timing control unit 11B includes a second fuse F2, a second capacitor C2, a second MOS transistor MN2 and a plurality of inverters I4, I5 and I6.

The timing control unit 11 controls the first and the second precharge control signals apcg1 and apcg2 by selectively blowing the first and the second fuse F1 and F2.

For instance, at a wafer-level test, if the first fuse F1 is blown by a laser, the first precharge control signal apcg1 is activated as a logic high level because charge stored in the first capacitor C1 is discharged and a voltage level of an input of the inverter I1 becomes a voltage level of the ground voltage VDD. In case that the first fuse F1 is not blown, the first precharge control signal apcg1 is outputted as a logic low level.

Herein, the timing control unit 11 includes two unit timing control units, i.e., the first and the second unit timing control units 11A and 11B. However, the timing control unit 11 can includes more unit timing control units.

Figure 4:
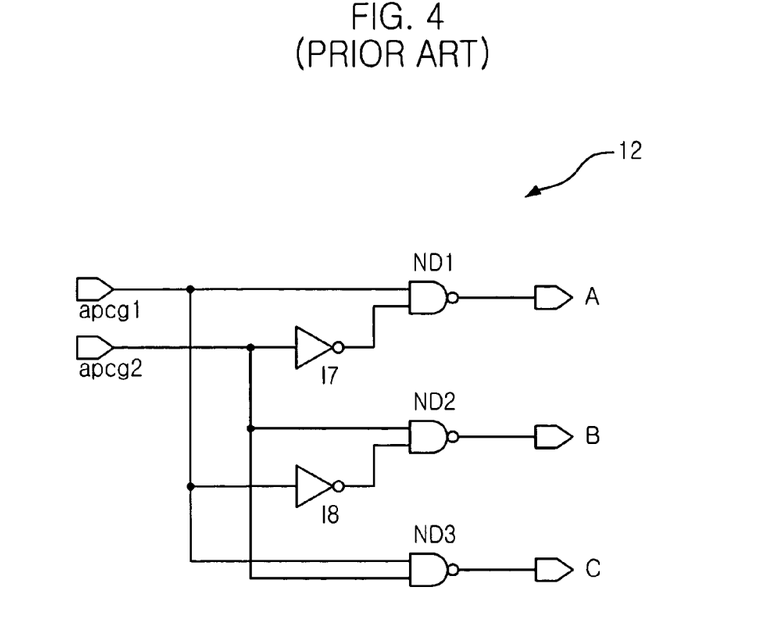
FIG. 4 is a schematic circuit diagram showing an auto-precharge timing decoder shown in FIG. 2.

FIG. 4 is a schematic circuit diagram showing the auto-precharge timing decoder 12 shown in FIG. 2.

As shown, the auto-precharge timing decoder 12 includes two inverters I7 and I8 and three NAND gates ND1, ND2 and ND3.

The auto-precharge timing decoder 12 decodes the first and the second precharge control signals apcg1 and apcg2 for selectively activating and outputting the plurality of decoded signals A, B and C.

Thereafter, the auto-precharge timing control unit 13 delays the auto-precharge performing signal apcgpb for a predetermined time and outputs the delayed auto-precharge performing signal apcgpb in response to the plurality of decoded signals A, B and C.

Meanwhile, timing of the auto-precharge operation is determined by the write recovery time as described above. The write recovery time is variable depending on a column address strobe (CAS) latency. The CAS latency (CL) is the ratio between column access time and a clock cycle time. That is, the CL shows how many cycles of the clock signal are spent while performing a read operation of a semiconductor memory device.

However, if the write recovery time keeps its value regardless of the CL, a semiconductor memory device can operate abnormally when the CL changes.

Generally, a semiconductor memory device changes value of the CL depending on a frequency change of the clock signal to be operated stably. The conventional semiconductor memory device can not control the auto-precharge operation depending on the CL. Therefore, there occur some errors when a value of the CL is changed due to the frequency change of the clock signal.

SUMMARY OF INVENTION

It is, therefore, an object of the present invention to provide a semiconductor memory device having ability of controlling a write recovery time depending on a frequency of a clock signal.

In accordance with an aspect of the present invention, there is provided a semiconductor memory device including a CAS latency mode detecting means for outputting a CAS latency control signal in response to a CAS latency mode; and an auto-precharge control means for controlling timing of an auto-precharge operation in response to the CAS latency control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 5:
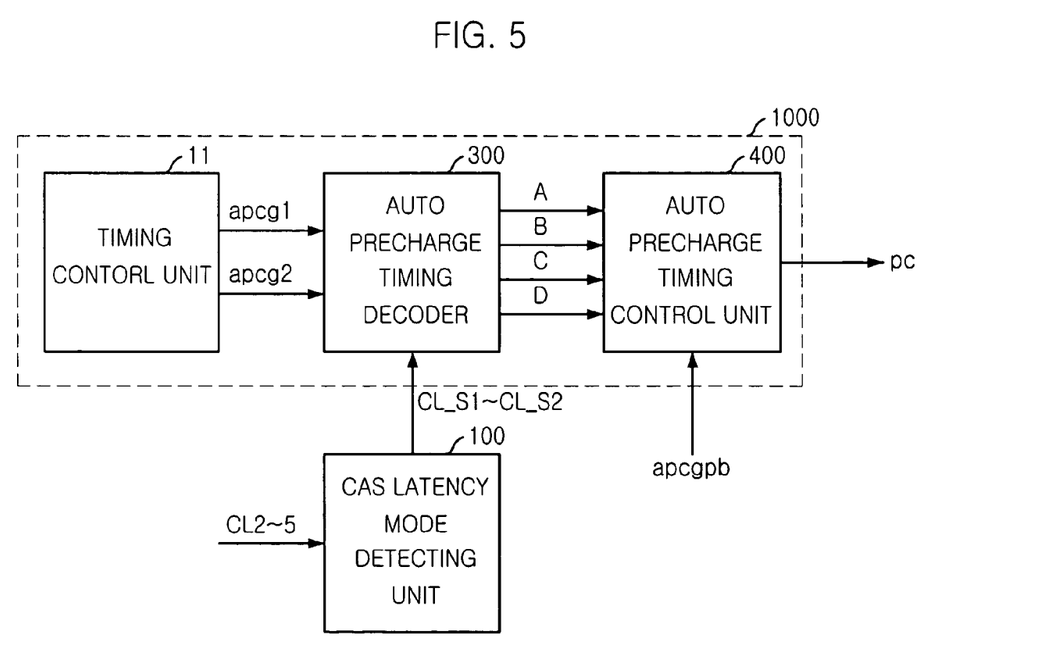
FIG. 5 is a block diagram showing a semiconductor memory device in accordance with a preferred embodiment of the present invention.

FIG. 5 is a block diagram showing a semiconductor memory device in accordance with a preferred embodiment of the present invention.

As shown, the semiconductor memory device includes an auto-precharge control unit 1000 and a column address strobe (CAS) latency mode detecting unit 100.

The CAS latency mode detecting unit 100 generates a first and a second CAS latency control signals CL_S$_1$ and CL_S2 in response to a CAS latency mode. The auto-prechrage control unit 1000 controls timing of an auto-precharge operation in response to the first and the second CAS latency control signals CL_S$_1$ and CL_S2.

The auto-precharge control unit 1000 includes a timing control unit 200, an auto-precharge timing decoder 300 and an auto-precharge timing control unit 400.

The timing control unit 11 generates a first and a second precharge control signals apcg1 and apcg2. The auto-precharge timing decoder 300 decodes the first and the second precharge control signals apcg1 and apcg2 and the first and the second CAS latency control signals CL_SL and CL_S2 for generating and outputting a plurality of decoded signals A, B, C and D. Herein, the auto-precharge timing decoder 300 activates one of the plurality of decoded signals A, B, C and D.

The auto-precharge timing control unit 400 delays an auto-precharge performing signal apcgpb in response to the plurality of decoded signals A, B, C and D for outputting the delayed auto-precharge performing signal apcgpb. Herein, how long the auto-precharge performing signal apcgpb is delayed is determined by the plurality of decoded signals A, B, C and D.

The timing control unit 11 includes a plurality of fuses for outputting the first and the second precharge control signals apcg1 and apcg2. The structure of the timing control unit 11 is the same as that of the timing control unit included in the conventional semiconductor memory device.

Figure 6:
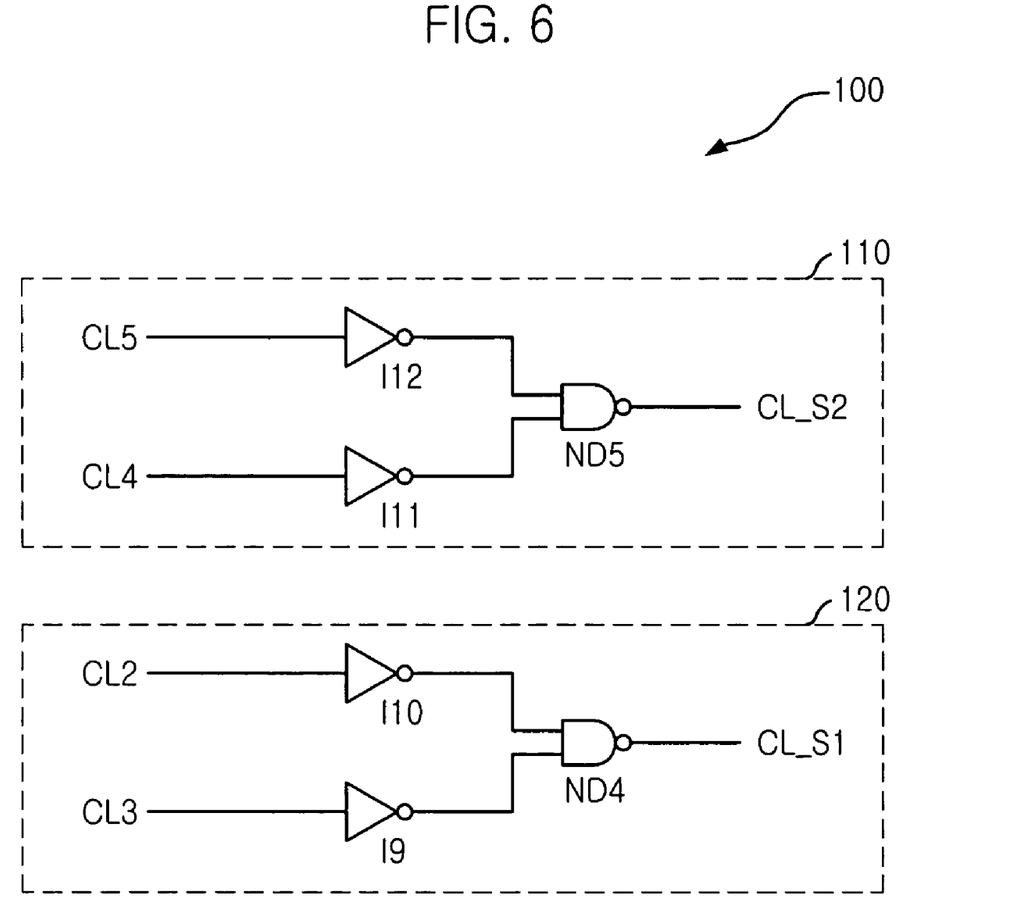
FIG. 6 is a schematic circuit diagram showing a column address strobe (CAS) latency mode detecting unit shown in FIG. 5.

FIG. 6 is a schematic circuit diagram showing the CAS latency mode detecting-unit 100 shown in FIG. 5.

As shown, the CAS latency mode detecting unit 100 includes a first unit CAS latency mode detector 110 and a second unit CAS latency mode detector 120.

In detail, each of the first and the second unit CAS latency mode detector 110 and 120 receives two CAS latency mode signals for generating a CAS latency control signal. That is, the second unit CAS latency mode detector 120 receives a first and a second CAS latency mode signals CL2 and CL3 to output the first CAS latency control signal CL_S1. Likewise, the first unit CAS latency mode detector 110 receives a third and a fourth CAS latency mode signals CL4 and CL5.

The first CAS latency mode detector 110 includes two inverters I11 and I12 and a NAND gate ND5. The two inverters I11 and I12 receive the third and the fourth CAS latency mode signals CL4 and CL5 respectively. The NAND gate ND5 performs a logic operation to outputted signals from the two inverters I11 and I12 to output the second CAS latency control signal CL_S2.

The structure and the operation of the second CAS latency mode detector 120 are the same as those of the first CAS latency mode detector 110.

If a CAS latency is 2 or 3, the CAS latency mode detecting unit 100 activates and outputs the first CAS latency control signal CL_S1. On the other hand, if the CAS latency is 4 or 5, the CAS latency mode detecting unit 100 activates and outputs the second CAS latency control signal CL_S2.

Herein, the CAS latency mode detecting unit 100 includes two unit CAS latency mode detectors. However, the CAS latency mode detecting unit 100 can include more unit CAS latency mode detectors if there are more CAS latency mode signals besides the first to the fourth CAS latency mode signals CL2 to CL5. In addition, it is also possible to arrange the unit CAS latency mode signals differently.

Figure 7:
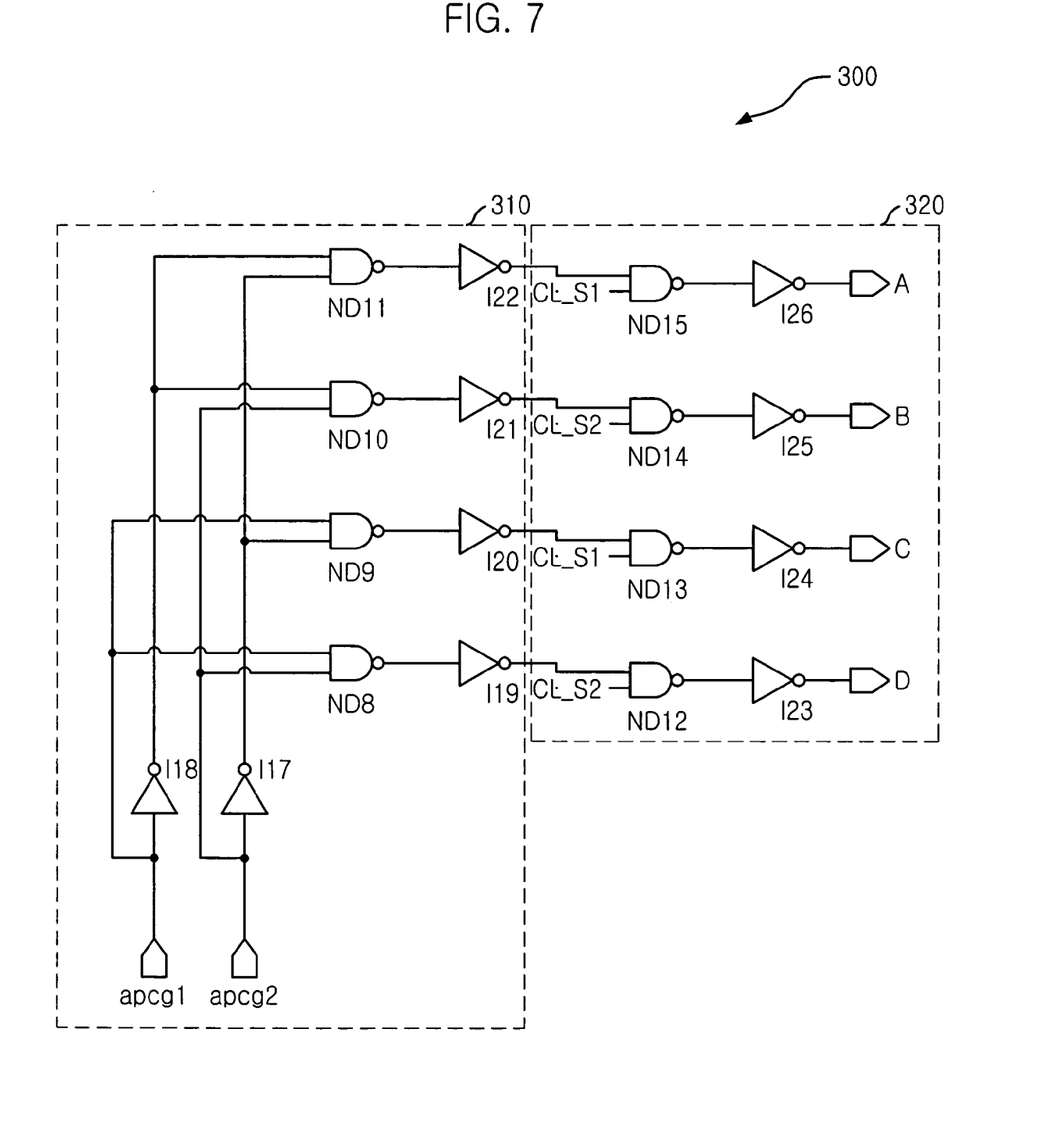
FIG. 7 is a schematic circuit diagram showing an auto-precharge timing decoder shown in FIG. 5.

FIG. 7 is a schematic circuit diagram showing the auto-precharge timing decoder 300 shown in FIG. 5.

As shown, the auto-precharge timing decoder 300 includes an internal decoder 310 and a signal mixing unit 320.

The internal decoder 310 including a plurality of inverters and NAND gates to receive and decode the first and the second precharge control signals apcg1 and apcg2; and, thus, to output the decoded signals to the signal mixing unit 320.

The signal mixing unit 320 also includes a plurality of NAND gates and inverters. The signal mixing unit 320 receives the first and the second CAS latency control signals CL_SL and CL_S2, and also receives the decoded signals outputted from the internal decoder 310. The signal mixing unit 320 performs a logic operation on the decoded signals from the internal decoder 310 and the first and the second CAS latency control signals CL_S1 and CL_S2 in order to output the plurality of decoded signals A, B, C and D.

Figure 8:
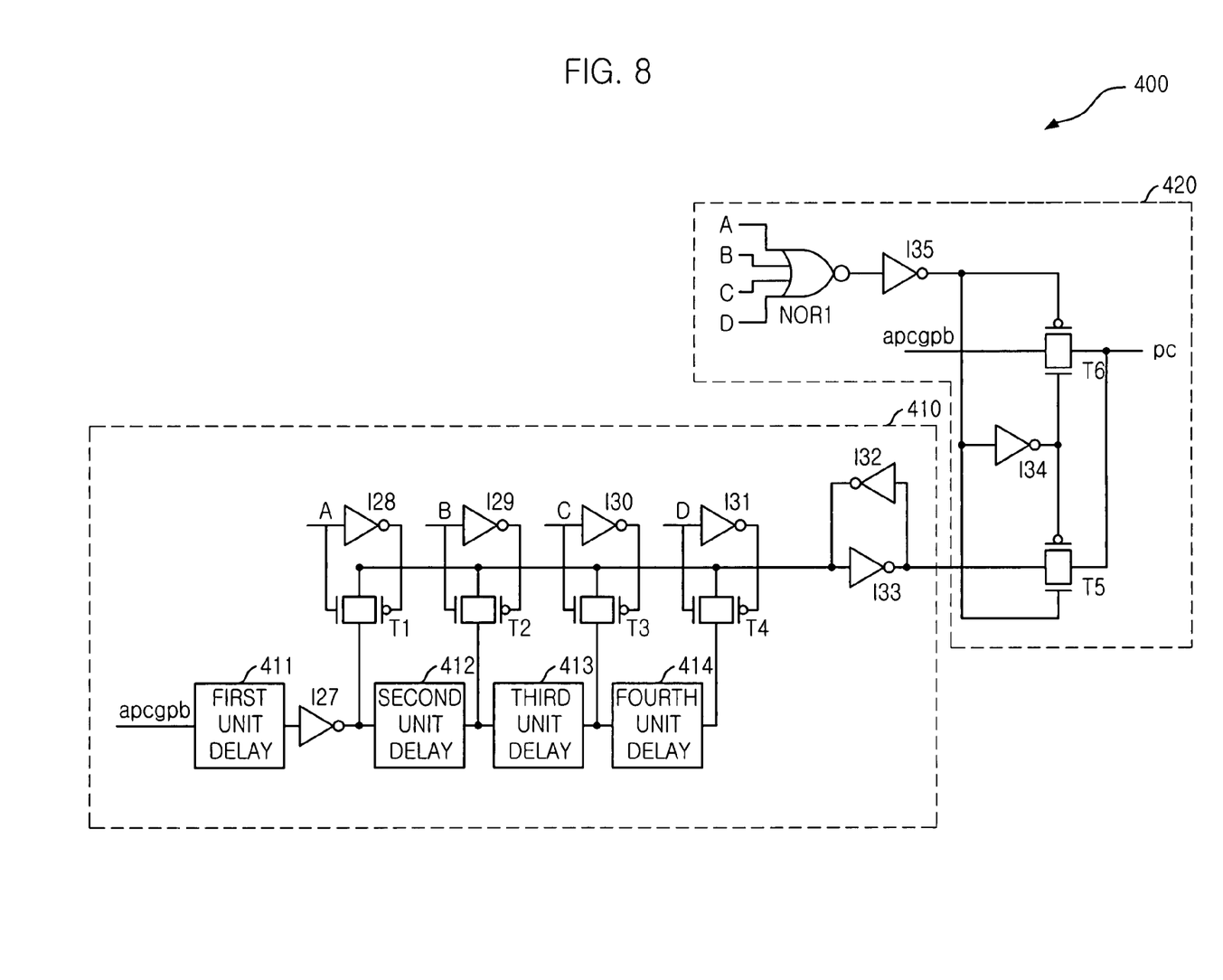
FIG. 8 is a schematic circuit diagram showing an auto-precharge timing control unit shown in FIG. 5.

FIG. 8 is a schematic circuit diagram showing the auto-precharge timing control unit 400.

As shown, the auto-precharge timing control unit 400 includes a delay unit 410 and a signal output unit 420.

The delay unit 410 serves to delay the auto-precharge performing signal apcgpb in response to the decoded signals A, B, C and D, and serves to output the delayed auto-precharge performing signal apcgpb to the signal output unit 420. The signal output unit 420 receives the decoded signals A, B, C and D, the auto-precharge performing signal apcgpb and the delayed auto-precharge performing signal apcgpb from the delay unit 410.

If all of the decoded signals A, B, C and D are inactivated, the signal output unit 420 outputs the auto-precharge performing signal apcgpb. On the other hand, if one of the decoded signals A, B, C and D is activated, the signal output unit 420 outputs the delayed auto-precharge performing signal apcgpb.

The delay unit 410 includes first to fourth unit delays 411 to 414, first to fourth transfer gates T1 to T4 and a plurality of inverters I27 to I33.

The first unit delay 411 receives the auto-precharge performing signal apcgpb to delay it. The first transfer gate T1 is turned on by the decoded signal A in order to transfer an output signal from the first unit delay 411 to a latch formed by the I32 and the I33. The second unit delay 412 delays an output signal from the first unit delay 411. The second transfer gate T2 is turned on by the decoded signal B in order to transfer an output signal from the second unit delay 412 to the latch.

Likewise, the third unit delay 413 delays an output signal from the second unit delay 412. The third transfer gate T3 is turned on by the decoded signal C in order to transfer an output signal from the third unit delay 413 to the latch. The fourth unit delay 414 delays an output signal from the third unit delay 413. The fourth transfer gate T4 is turned on by the decoded signal D in order to transfer an output signal from the fourth unit delay 414 to the latch.

The latch formed by the inverters I32 and I33 serves to store a signal outputted from the plurality of decoded signals A, B, C and D.

The signal output unit 420 includes a NOR gate NOR1, a fifth transfer gate T5, a sixth transfer gate T6 and two inverters I34 and I35. The NOR gate NOR1 receives the plurality of decoded signals A, B, C and D to perform a logic NOR operation to the plurality of decoded signals A, B, C and D, and outputs the result to the I35.

If an output signal from the inverter I35 is in a logic low level, the sixth transfer gate is turned on and transfers the auto-precharge performing signal apcgpb as an output of the signal output unit 420. On the other hand, if the output signal from the inverter I35 is in a logic high level, the fifth transfer gate T5 is turned on and transfers the delayed auto-precharge performing signal apcgpb outputted from the delay unit 410 as the output of the signal output unit 420.

An operation of the semiconductor memory device in accordance with the preferred embodiment of the present invention is described below referring to FIGS. 5 to 8.

The CAS latency mode detecting unit 100 selectively activates and outputs the first and the second CAS latency control signals CL_S1 and CL_S2 in response to the first to the fourth CAS latency mode signals CL2 to CL5. For instance, if the CAS latency is 3, the CAS latency mode detecting unit 100 activates the first CAS latency control signal CL_SL and outputs the activated first CAS latency control signal CL_SL to the auto-precharge timing decoder 300.

Meanwhile, the timing control unit 11 generates the first and the second precharge control signals apcg1 and apcg2 by selectively blowing fuses included in the timing control unit 11.

Thereafter, the internal decoder 310 decodes the first and the second precharge control signals apcg1 and apcg2, and outputs the decoded signals to the signal mixing unit 320. The signal mixing unit 320 performs a logic operation to outputted signals from the internal decoder 310 and the first and the second CAS latency control signals $CL\_S_1$ and $CL\_S2$ in order to activate and output one of the plurality of decoded signals A, B, C and D.

Thereafter, the auto-precharge timing control unit 400 delays the auto-precharge performing signal apcgpb in response to the plurality of decoded signals A, B, C and D. An activated signal among the plurality of decoded signals A, B, C and D determines delay amount of the auto-precharge performing signal apcgpb.

For instance, if the decoded signal C is activated, the third and the fifth transfer gates T3 and T5 are turned on and the other transfer gates, i.e., T1, T2, T4 and T6, are turned off. Therefore, the auto-precharge performing signal apcgpb is delayed passing through the first to the third unit delays 411 to 413 and outputted through the fifth transfer gate T5.

If all of the plurality of decoded signals A, B, C and D are inactivated, the sixth transfer gate T6 is turned on and the other transferring gates, i.e., T1 to T5, are turned off. Therefore, the auto-precharge performing signal apcgpb is not delayed and outputted from the auto-precharge timing control unit 400.

Thereafter, in response to an output signal of the auto-precharge timing control unit 400, the auto-precharge operation is performed.

As described above, the semiconductor memory device in accordance with the present invention can control timing of the auto-precharge operation according to a CAS latency. Therefore, the semiconductor memory device can perform the auto-precharge operation at proper time even if the CAS latency is changed.

Controlling timing of the auto-precharge operation according to the CAS latency means that the write recovery time is controlled according to the CAS latency. That is, the semiconductor memory device in accordance with the present invention can change the write recovery time when the write recovery time is required to be changed due to the change of the CAS latency.

A major cause of the change of the CAS latency is a change of a clock frequency. Therefore, the semiconductor memory device in accordance with the present invention can operate stably and reliably even if the clock frequency and the CAS latency are changed.

The present application contains subject matter related to Korean patent application No. 2003-76796, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device capable of controlling a timing of an auto-precharge operation, comprising:
   a CAS latency mode detecting means for outputting a CAS latency control signal in response to a CAS latency mode; and
   an auto-precharge control means for controlling the timing of an auto-precharge operation in response to the CAS latency control signal, wherein the auto-precharge control means includes:
   an auto-precharge timing decoder for activating one of a plurality of output signals from the auto-precharge timing decoder by decoding the CAS latency control signal and a control signal; and
   an auto-precharge timing control unit for controlling output timing of an auto-precharge performing signal in response to the activated output signal.

2. The semiconductor memory device as recited in claim 1, wherein the auto-precharge control means includes:
   a timing control unit for generating the control signal to control timing of the auto-precharge operation.

3. The semiconductor memory device as recited in claim 2, wherein the timing control unit includes a plurality of fuses and outputs the control signal by selectively blowing the plurality of fuses.

4. The semiconductor memory device as recited in claim 2, wherein the CAS latency mode detecting means includes a plurality of unit CAS latency mode detectors, each for selectively activating and outputting the CAS latency control signal according to the GAS latency mode.

5. The semiconductor memory device as recited in claim 4, wherein each of the plurality of unit GAS latency mode detectors includes a logic gate for performing a logic operation to two GAS latency modes for outputting the resultant of the logic operation.

6. The semiconductor memory device as recited in claim 2, wherein the auto-precharge timing decoder includes:
   an internal decoder for decoding the control signal; and
   a signal mixing unit for performing a logic operation to a plurality of signals outputted from the internal decoder and the GAS latency mode control signal to output the resultant of the logic operation.

7. The semiconductor memory device as recited in claim 6, wherein the auto-precharge timing control unit includes:
   a delay means including a plurality of unit delays for delaying the auto-precharge performing signal depending on the plurality of output signals from the auto-precharge timing decoder; and
   a signal output unit which receives the auto-precharge performing signal and an output signal from the delay means for outputting the auto-precharge performing signal when all of the plurality of output signals from the auto-precharge timing decoder are inactivated and for outputting the output signal from the delay means when one of the plurality of output signals from the auto-precharge timing decoder is activated.

8. The semiconductor memory device as recited in claim 7, wherein the delay means includes:
   a first unit delay for delaying the auto-precharge performing signal;
   a first transferring gate turned on by a first output signal among outputted signals from the auto-precharge timing decoder for transferring an output signal from the first unit delay;
   a second unit delay for delaying an output signal from the first unit delay;
   a second transferring gate turned on by a second output signal among outputted signals from the auto-precharge timing decoder for transferring an output signal from the second unit delay;
   a third unit delay for delaying an output signal from the second unit delay;
   a third transferring gate turned on by a third output signal among outputted signals from the auto-precharge timing decoder for transferring an output signal from the third unit delay;
   a fourth unit delay for delaying an output signal from the third unit delay;
   a fourth transferring gate turned on by a fourth output signal among outputted signals from the auto-precharge timing decoder for transferring an output signal from the fourth unit delay; and a latch for latching an output signal from the first to fourth transferring gates.

9. The semiconductor memory device as recited in claim 7, the signal output unit includes:

a logic gate for performing a logic operation to the plurality of output signals from the auto-precharge timing decoder;

a first transferring gate which is turned on when an output signal from the logic gate is in a logic low level to output the auto-precharge performing signal; and a second transferring gate which is turned on when the output signal from the logic gate is in a logic high level to output the output signal from the delay means.

10. A method of controlling timing of a precharge operation according to a CAS latency mode comprising a step of:

detecting the CAS latency mode;

outputting a delay signal corresponding to the CAS latency mode;

outputting an auto-precharge signal after delaying the auto-precharge signal by passing the auto-precharge signal through one or more unit delays; and performing an auto-precharge operation in response to the auto-precharge signal, wherein the number of the unit delays where the auto-precharge signal passes through is determined by the delay signal.

11. A semiconductor memory device, comprising:

a CAS latency mode detecting means for outputting a CAS latency control signal in response to a CAS latency mode; and an auto-precharge control means for controlling the timing of an auto-precharge operation in response to one of plural signals generated by decoding the CAS latency control signal.

12. The semiconductor memory device as recited in claim 11, wherein the auto-precharge control means includes:

a timing control unit for generating a control signal to control timing of the auto-precharge operation;

an auto-precharge timing decoder for activating one of a plurality of output signals by decoding the CAS latency control signal and the control signal; and an auto-precharge timing control unit for controlling output timing of an auto-precharge performing signal in response to the activated output signal.

13. The semiconductor memory device as recited in claim 12, wherein the timing control unit includes a plurality of fuses and outputs the control signal by selectively blowing the plurality of fuses.

14. The semiconductor memory device as recited in claim 12, wherein the CAS latency mode detecting means includes a plurality of unit CAS latency mode detectors, each for selectively activating and outputting the GAS latency control signal according to the GAS latency mode.

15. The semiconductor memory device as recited in claim 14, wherein each of the plurality of unit CAS latency mode detectors includes a logic gate for performing a logic operation to two CAS latency modes for outputting the resultant of the logic operation.

16. The semiconductor memory device as recited in claim 12, wherein the auto-precharge timing decoder includes:

an internal decoder for decoding the control signal; and a signal mixing unit for performing a logic operation to a plurality of signals outputted from the internal decoder and the CAS latency mode control signal to output the resultant of the logic operation.

17. The semiconductor memory device as recited in claim 16, wherein the auto-precharge timing control unit includes:

a delay means including a plurality of unit delays for delaying the auto-precharge performing signal depending on the plurality of output signals from the auto-precharge timing decoder; and a signal output unit which receives the auto-precharge performing signal and an output signal from the delay means for outputting the auto-precharge performing signal when all of the plurality of output signals from the auto-precharge timing decoder are inactivated and for outputting the output signal from the delay means when one of the plurality of output signals from the auto-precharge timing decoder is activated.

18. The semiconductor memory device as recited in claim 17, wherein the delay means includes:

a first unit delay for delaying the auto-precharge performing signal;

a first transferring gate turned on by a first output signal among outputted signals from the auto-precharge timing decoder for transferring an output signal from the first unit delay;

a second unit delay for delaying an output signal from the first unit delay;

a second transferring gate turned on by a second output signal among outputted signals from the auto-precharge timing decoder for transferring an output signal from the second unit delay;

a third unit delay for delaying an output signal from the second unit delay;

a third transferring gate turned on by a third output signal among outputted signals from the auto-precharge timing decoder for transferring an output signal from the third unit delay;

a fourth unit delay for delaying an output signal from the third unit delay;

a fourth transferring gate turned on by a fourth output signal among outputted signals from the auto-precharge timing decoder for transferring an output signal from the fourth unit delay; and a latch for latching an output signal from the first to fourth transferring gates.

19. The semiconductor memory device as recited in claim 17, the signal output unit includes:

a logic gate for performing a logic operation to the plurality of output signals from the auto-precharge timing decoder;

a first transferring gate which is turned on when an output signal from the logic gate is in a logic low level to output the auto-precharge performing signal; and a second transferring gate which is turned on when the output signal from the logic gate is in a logic high level to output the output signal from the delay means.

* * * * *